(12) United States Patent
Kim et al.

(10) Patent No.: US 7,098,814 B2
(45) Date of Patent: Aug. 29, 2006

(54) METHOD AND APPARATUS FOR ENCODING AND/OR DECODING DIGITAL DATA

(75) Inventors: Jung-hoe Kim, Seoul (KR); Sang-wook Kim, Seoul (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/751,464

(22) Filed: Jan. 6, 2004

(65) Prior Publication Data

US 2004/0183703 A1  Sep. 23, 2004

(30) Foreign Application Priority Data

Mar. 22, 2003 (KR) ............ 10-2003-0017979

(51) Int. Cl.
*H03M 7/34* (2006.01)
(52) U.S. Cl. ............ 341/51; 341/52
(58) Field of Classification Search ........ 341/50–107
See application file for complete search history.

(56) References Cited

U.S. PATENT DOCUMENTS

| | | | |
|---|---|---|---|
| 6,199,038 B1 | 3/2001 | Tsutsui | |
| 6,208,273 B1 * | 3/2001 | Dye et al. | 341/51 |
| 6,449,393 B1 * | 9/2002 | Peters | 382/239 |
| 6,778,965 B1 * | 8/2004 | Bruekers et al. | 704/500 |
| 6,798,362 B1 * | 9/2004 | Modha | 341/51 |
| 2004/0015697 A1 * | 1/2004 | de Queiroz | 713/176 |
| 2004/0181394 A1 * | 9/2004 | Kim et al. | 704/200.1 |

FOREIGN PATENT DOCUMENTS

| | | |
|---|---|---|
| EP | 0 918 407 A2 | 5/1999 |
| EP | 1 292 036 A2 | 3/2003 |
| KR | 97-0061299 | 11/1997 |

OTHER PUBLICATIONS

Rob Koenen,"MPEG-4 Overview", International Organization for Standardization ISO/IECJTC1/SC29/WG11 Coding of Moving Pictures and Audio, 2002, pp. 1-60, N4668, no month.

Ralf Geiger et al., "Fine Grain Scalable Perceptual and Lossless Audio Coding Based on INTMDCT", IEEE International Conference on Acoustics, Speech, and Signal Processing, 2003, pp. 445-448, vol. 1, No. 6, New York, NY, no month.

* cited by examiner

*Primary Examiner*—Linh V. Nguyen
(74) *Attorney, Agent, or Firm*—Buchanan Ingersoll & Rooney PC

(57) ABSTRACT

Provided are a method and apparatus for encoding and decoding digital data. The method includes: mapping a plurality of samples constituting the digital data onto bit planes; and selectively encoding all of bit-sliced data of the bit planes from bit-sliced data composed of most significant bits mapped onto the bit planes to bit-sliced data composed of least significant bits in consideration of an encoding efficiency or according to a transformed bit-sliced encoding method. Accordingly, an encoding efficiency can be increased.

16 Claims, 7 Drawing Sheets

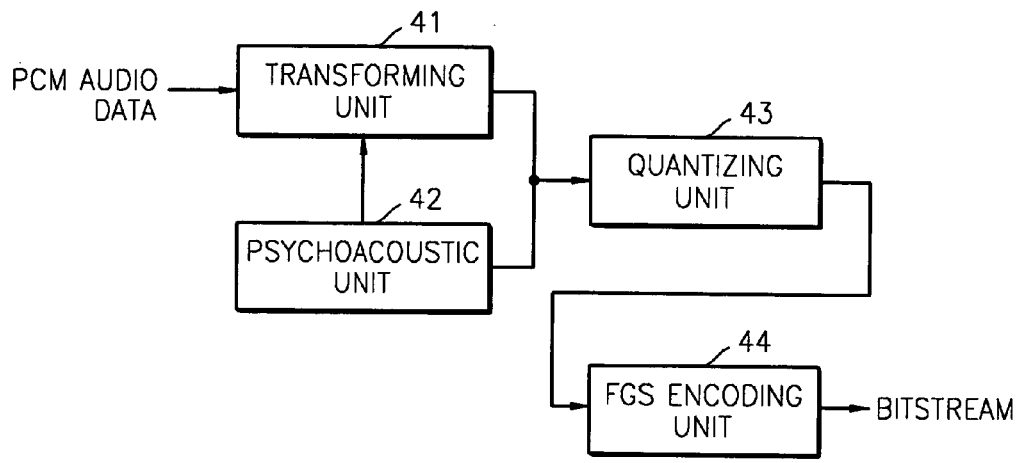
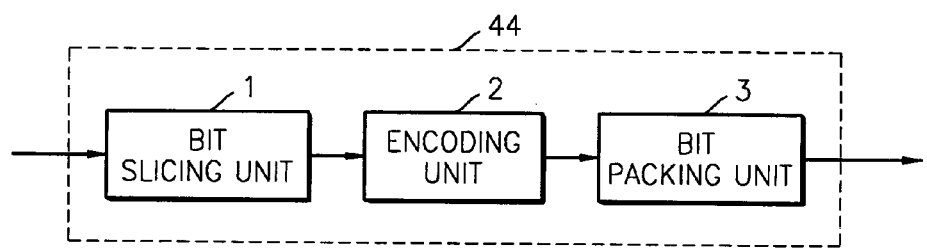
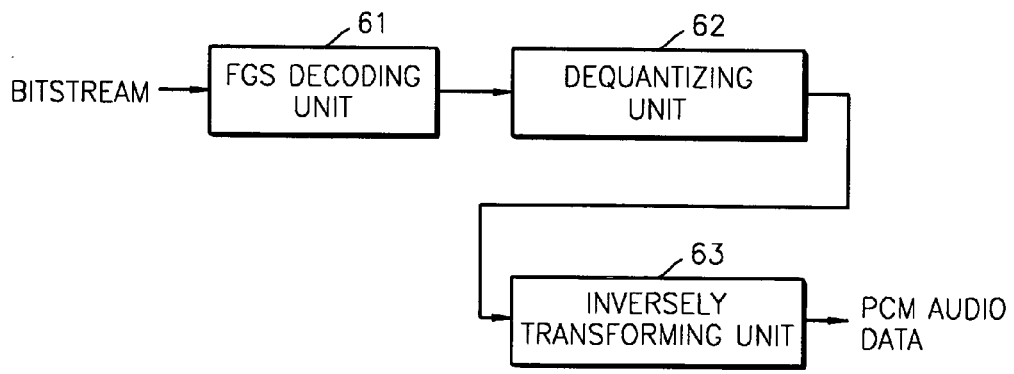

US 7,098,814 B2

METHOD AND APPARATUS FOR ENCODING AND/OR DECODING DIGITAL DATA

BACKGROUND OF THE INVENTION

This application claims the priority of Korean Patent Application No. 2003-17979, filed on Mar. 22, 2003, in the Korean Intellectual Property Office, the disclosure of which is incorporated herein in its entirety by reference.

1. Field of the Invention

The present invention relates to encoding and decoding of digital data, and more particularly, to a method and apparatus for encoding and decoding bit rate scalable digital data.

2. Description of the Related Art

As digital signal processing technologies advance, audio signals are mostly stored and played back as digital data. Digital audio storage and/or playback devices sample and quantize analog audio signals, transform the analog audio signals into pulse code modulation (PCM) audio data, which is a digital signal, and store the PCM audio data in an information storage medium such as a compact disc (CD), a digital versatile disc (DVD), or the like, so that a user can play back data from the information storage medium when he/she desires to listen to the PCM audio data. Digital audio signal storage and/or reproduction methods considerably improve sound quality and remarkably reduce the deterioration of sound caused by long storage periods compared to analog audio signal storage and/or reproduction methods used on a long-play (LP) record, a magnetic tape, or the like. However, the large amount of digital data sometimes poses a problem for storage and transmission.

In order to solve these problems, a wide variety of compression technologies for reducing the amount of digital audio data are used. Moving Picture Expert Group audio standards drafted by the International Standard Organization (ISO) or AC-2/AC-3 technologies developed by Dolby adopt a method of reducing the amount of data using a psychoacoustic model, which results in an effective reduction in the amount of data regardless of the characteristics of signals. In other words, MPEG audio standards and AC-2/AC-3 technologies provide almost the same sound quality as a CD only at a bit rate of 64 Kbps–384 Kbps, that is, at ⅙–⅛ that of existing digital encoding technologies.

However, all these technologies comply with a method of detecting, quantizing, and encoding digital data in an optimum state at a fixed bit rate. Thus, when digital data is transmitted via a network, transmission bandwidth may be reduced due to poor network conditions. Also, the network may be disconnected, such that network service is not available. Also, when digital data is transformed into a smaller bitstream so as to be suitable for mobile devices having a limited storage capacity, re-encoding should be performed to reduce the amount of data. To achieve this, a considerable amount of calculation is required.

For this reason, the present applicant filed an application for "Digital Encoding and/or Decoding Method and Apparatus Using Bit-Sliced Encoding Technology" as Korean Patent Application No. 97-61299 on Nov. 19, 1997 in the Korean Intellectual Property Office and has been granted Korean Patent Registration No. 338801 on May 18, 2002. According to bit-sliced encoding technology, a bitstream, which has been encoded at a high bit rate, can be transformed into a bitstream having a low bit rate. Since reconstructing can be achieved using only a portion of a bitstream, even if a network is overloaded, the performance of a decoder is poor, or a user demands a low bit rate, the user can be provided with service at moderate sound quality using only a portion of the bitstream (though the performance of the decoder may deteriorate as much as low bit rate).

However, according to the bit-sliced encoding technology, all binary data mapped into bit planes is encoded. Thus, if more than half of the bit planes is values of "0", the values of "0" are all encoded, which may reduce an encoding efficiency.

SUMMARY OF THE INVENTION

The present invention provides a method and apparatus for encoding and decoding digital data by which an encoding efficiency can be improved when using a bit-sliced encoding technology.

According to an aspect of the present invention, there is provided a method of encoding digital data. The method includes: mapping a plurality of samples constituting the digital data onto bit planes; and selectively encoding all of bit-sliced data of the bit planes from bit-sliced data composed of most significant bits mapped onto the bit planes to bit-sliced data composed of least significant bits in consideration of an encoding efficiency or according to a transformed bit-sliced encoding method.

The method further includes packaging the encoded samples into a hierarchical structure.

According to the transformed bit-sliced encoding method, a portion of bit-sliced data constituting a predetermined bit plane is lossless-encoded, and position information of a peak, the remaining bit plane information, and peak data are encoded as side information.

The encoding includes: expressing the samples composed of sign data and magnitude data as binary data each having the same number of bits; bit-slicing magnitude data constituting expressed digital data; lossless-encoding bit-sliced data composed of most significant bits; encoding sign data of a sample that first has a non-zero bit of the encoded bit-sliced data; and performing the lossless-encoding and encoding from bit-sliced data composed of next significant bits to bit-sliced data composed of least significant bits.

The encoding is performed according to Huffman-coding or arithmetic-coding.

Side information corresponding to a plurality of layers and a plurality of encoded quantization samples are packaged into a hierarchical structure.

According to another aspect of the present invention, there is provided an apparatus for encoding digital data. The apparatus includes: a bit slicing unit that bit-slices a plurality of samples constituting the digital data to obtain bit-sliced data; and an encoding unit that selectively encodes all of bit-sliced data of bit planes from bit-sliced data composed of most significant bits of the bit planes to bit-sliced data composed of least significant bits in consideration of an encoding efficiency or according to a transformed bit-sliced encoding method.

The apparatus further includes a bit packing unit that packages the samples encoded by the encoding unit into a hierarchical structure.

The encoding unit lossless-endoces bit-sliced data of a portion of a predetermined bit plane according to the transformed bit-sliced encoding method, and position information of a peak, the remaining bit plane information, and peak data are encoded as side information.

The bit slicing unit bit-slices magnitude data of samples that are composed of sign data and magnitude data and are expressed as binary data each having the same number of bits, and the encoding unit lossless-encodes bit-sliced data composed of most significant bits and sign data of a sample of the lossless-encoded bit-sliced data that first has a non-zero bit and then performs lossless-encoding to bit-sliced data composed of least significant bits in the same manner.

The encoding unit Huffman-codes or arithmetic-codes the bit-sliced data.

The bit packing unit packages side information and a plurality of lossless-encoded quantization samples corresponding to a plurality of layers into a hierarchical structure.

According to still another aspect of the present invention, there is provided a method of decoding digital data. The method includes: analyzing a bitstream to obtain at least one encoded bit-sliced data corresponding to a predetermined bit plane and side information encoded according to a transformed bit-sliced encoding method; decoding bit-sliced data corresponding to the predetermined bit plane with reference to the bit-sliced data and the side information; and bit-combining the decoded bit-sliced data to obtain samples constituting the digital data.

The analyzing includes decoding peak position information, the remaining bit plane information, and peak data as side information.

According to yet another aspect of the present invention, there is provided an apparatus for decoding digital data. The apparatus includes: a bitstream analyzing unit that analyzes a bitstream to obtain at least one encoded bit-sliced data corresponding to a predetermined bit plane and side information encoded according to a transformed bit-sliced encoding method; a decoding unit that decodes bit-sliced data corresponding to the bit plane with reference to the bit-sliced data and the side information; and a bit combining unit that bit-combines the decoded bit-sliced data to obtain samples constituting the digital data.

The bitstream analyzing unit obtains peak position information, the remaining bit plane information, and peak data as side information.

BRIEF DESCRIPTION OF THE DRAWINGS

The above and other features and advantages of the present invention will become more apparent by describing in detail exemplary embodiments thereof with reference to the attached drawings in which:

FIG. 4 is a block diagram of an example of the realization of the encoding apparatus shown in FIG. 1;

FIG. 5 is a detailed block diagram of an FGS encoding unit 44 shown in FIG. 4;

FIG. 6 is a block diagram of an example of the realization of the decoding apparatus shown in FIG. 2;

DETAILED DESCRIPTION OF THE INVENTION

Hereinafter, preferred embodiments of the present invention will be described in detail with reference to the attached drawings.

The overview of an encoding method of an encoding apparatus according to the present invention is as follows.

The encoding apparatus according to the present invention bit-slices input digital data and then encodes the data bits from significant bits to least significant bits. In other words, the encoding priority of data to be encoded depends on the relative significance of data bits. High priority bits have priority over low priority bits. Since significant bits are first encoded, if the number of bits that has been encoded up to now exceeds or is equal to an allowed bit range, encoding may stop finishing the generation of a bitstream. If generating the bitstream is interrupted, a portion of data decoded by a decoder may be lost, and thus the decoded data may be distorted compared to original data. However, since significant information is first encoded, the quality of the decoded data is not greatly degraded compared to the lost amount of data. Also, a decoding method according to an aspect of the present invention performs a process inverse to the encoding method.

Figure 1:
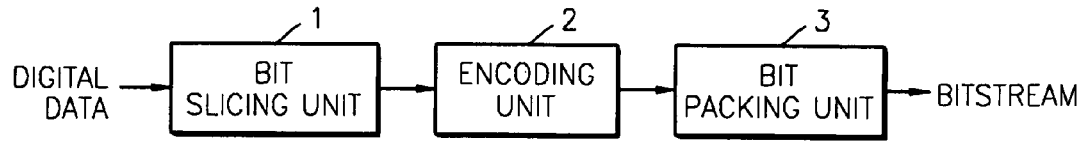
FIG. 1 is a block diagram of an encoding apparatus according to the present invention.

FIG. 1 is a block diagram of an encoding apparatus according to the present invention. Referring to FIG. 1, the encoding apparatus includes a bit slicing unit 1, an encoding unit 1, and a bit packing unit 3. In the present embodiment, digital data input to the encoding apparatus is binary data and samples constituting the digital data are expressed by the same number of bits. The digital data may be decimal data or hexadecimal data. In this case, the digital data is expressed by digits not by bits.

The bit slicing unit 1 slices the input digital data into bits and then arranges the data bits from most significant bits to least significant bits. The bit slicing unit 1 slices each of samples constituting the digital data into bits and then arranges the bits from most significant bits to least significant bits. In more detail, the bit slicing unit 1 takes the sign of each of the samples as sign data and takes the absolute value of each of the samples as magnitude data. The magnitude data is sliced into bits and packed into a plurality of bits to make new bit sequences. For example, if input samples are "−31, 12, −9, 7, 17, −23, . . . ", magnitude data "31, 12, 9, 7, 17, and 23" is obtained by taking the absolute values of the samples "−31, 12, −9, 7, 17, −23, . . . ", and the magnitude data "31, 12, 9, 7, 17, and 23" is expressed as binary digits below.

31: 11111b
12: 01100b
9: 01001b
7: 00111b
17: 10001b
23: 10111b

Most significant bits of the above binary data are packed into a group of bit-sliced data "100011". Bit-sliced data for next significant bits is "111000". Bit-sliced data for least significant bits is "101111".

The encoding unit 2 lossless-encodes the bit-sliced data obtained by the bit-slicing unit 1 from the highest priority bits to the lowest priority bits. In the present embodiment, since the highest priority bits are the most significant bits (MSBs), the most significant bit-sliced data is composed of the MSBs. Also, since the lowest priority bits are the least significant bits (LSBs), the least significant bit-sliced data is composed of the LSBs. Lossless-encoding may be arithmetic-coding or Huffman-coding.

The encoding unit 2 encodes sign data corresponding to non-zero magnitude data of the encoded magnitude data. The sign data must be encoded after the magnitude data is encoded. In the above binary data, after the bit-sliced data "100011" for the most significant bits is encoded, whether the sign data has to be encoded is determined. Since non-zero values of the first, fifth, and sixth bits of the bit-sliced data "100011" are first encoded, sign data corresponding to the first, fifth, and sixth bits is sequentially encoded and then next bit-sliced data "111000" is encoded. Encoding is performed to bit-sliced data "101111" composed of the least significant bits in the same manner.

The bit packing unit 3 packs the bit-sliced data encoded by the encoding unit 2 into a hierarchical bitstream according to their encoded order. The details of the packing process will be explained later.

Figure 2:
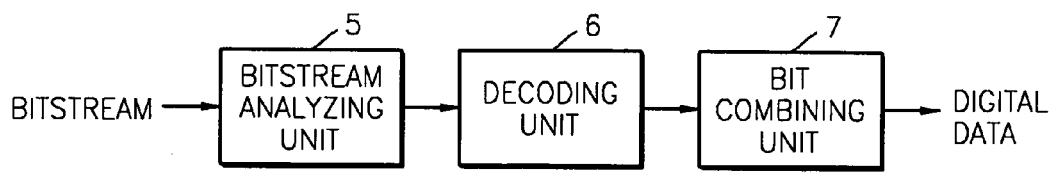
FIG. 2 is a block diagram of a decoding apparatus according to the present invention.

FIG. 2 is a block diagram of a decoding apparatus according to the present invention. Referring to FIG. 2, the decoding apparatus includes a bitstream analyzing unit 5, a decoding unit 6, and a bitstream combining unit 7. The bitstream analyzing unit 5 analyzes a bitstream sequentially, starting from the beginning part thereof. The bitstream analyzing unit 5 analyzes bit-sliced data for most significant bits out of the bitstream and then analyzes sign data out of the bitstream in the same order as described with reference FIG. 1. The encoded bit-sliced data is transmitted to the decoding unit 6 and the sign data is transmitted to the bit combining unit 7. Thereafter, the encoded bit-sliced data and the sign data are used to reconstruct original digital data.

The decoding unit 6 sequentially decodes the encoded bit-sliced data output from the bitstream analysing unit 5 from most significant data to least significant data, i.e., from bit-sliced data for most significant bits to bit-sliced data for least significant bits. The bit-sliced data can be reconstructed according to a process inverse to an algorithm used to encode the bit-sliced data in the encoding apparatus shown in FIG. 1.

The bit combining unit 7 reconstructs the bit-sliced data reconstructed by the decoding unit 6 to original digital data. The bit combining unit 7 reflects sign data of samples obtained by the bitstream analyzing unit 5, i.e., if values of sign data are minus values, multiplies the reconstructed magnitude data by −1 so as to finally obtain a minus value.

Figure 3:
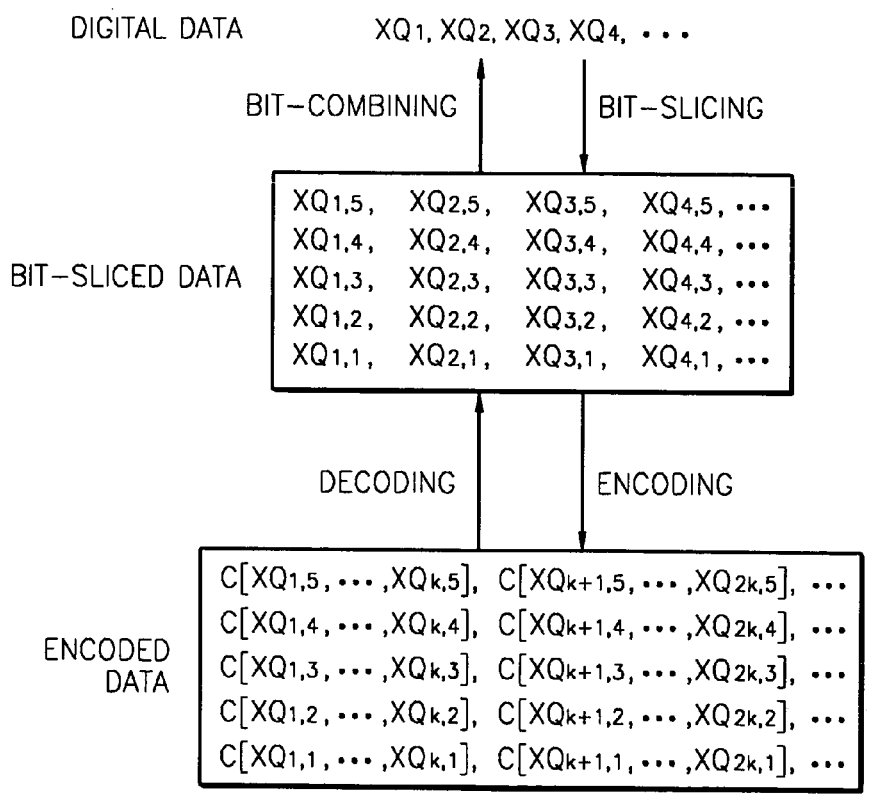
FIG. 3 is a referential view for explaining an encoding and/or decoding method performed by the encoding and/or decoding apparatus shown in FIG. 1 and/or FIG. 2.

FIG. 3 is a referential view for explaining an encoding and/or decoding method performed by the encoding and/or decoding apparatus of FIG. 1 and/or FIG. 2. Referring to FIG. 3, in the encoding method, when input digital data is "XQ1, XQ2, XQ3, XQ4, . . . ", each of which is composed of five bits, the bit slicing unit 1 of the encoding apparatus slices "XQ1" into "XQ1, 5, XQ1, 4, XQ1, 3, XQ1, 2, XQ1, 1", "XQ2" into "XQ2, 5, XQ2, 4, XQ2, 3, XQ2, 2, XQ2, 1", "XQ3" into "XQ3, 5, XQ3, 4, XQ3, 3, XQ3, 2, XQ3, 1", and "XQ4" into "XQ4, 5, XQ4, 4, XQ4, 3, XQ4, 2, XQ4, 1". The remaining input digital data is sliced in the same manner. Most significant bits are packed from bits corresponding to a low frequency to bits corresponding to a high frequency, sliced into predetermined units to form vectors, and the vectors are encoded. Here, C[XQ1,5, . . . ,XQk,5] is obtained by lossless-encoding vectors "XQ1,5, . . . ,XQk,5", and C[XQk+1,5, . . . ,XQ2k,5] is obtained by lossless-encoding vectors "XQk+1,5, . . . ,XQ2k,5". The remaining vectors are lossless-encoded in the same manner. Here k is an integer that is greater than or equal to "1".

According to the decoding method, "C[XQ1,5, . . . ,XQk,5], C[XQk+1,5, . . . ,XQ2k,5], . . . " of an input bitstream are decoded to obtain vectors "XQ1,5, . . . ,XQk,5, XQk+1,5, . . . , XQ2k,5, . . . ", and digital data "XQ1, XQ2, XQ3, XQ4, . . . " are obtained by combining bits. In other words, the decoding method performs a process inverse to the encoding method.

FIG. 4 is a block diagram of an example of the realization of the encoding apparatus shown in FIG. 1. Referring to FIG. 4, the encoding apparatus, which encodes audio data into a hierarchical structure so as to control a bit rate, includes a transforming unit 41, a psychoacoustic unit 42, a quantizing unit 43, and an FGS decoding unit 44.

The transforming unit 41 receives PCM audio data that is an audio signal in the time domain and transforms the PCM audio data into an audio signal in the frequency domain with reference to psychoacoustic model information provided by the psychoacoustic unit 42. The characteristics of audio signals able to be perceived by humans, hereinafter referred to as perceptual audio signals, are not much different in the time domain. In contrast, the characteristics of perceptual and unperceptual audio signals in the frequency domain are much different considering the psychoacoustic model. Thus, compression efficiency can be improved by assigning a different number of bits to each frequency band.

The psychoacoustic unit 42 provides information on a psychoacoustic model such as attack detection information or the like to the transforming unit 41, packs the audio signal transformed by the transforming unit 41 into sub-band audio signals, calculates a masking threshold for each of the sub-bands using a masking effect resulting from the interaction among the sub-band signals, and provides the masking threshold to the quantizing unit 43. The masking threshold indicates the maximum power of an audio signal that humans cannot perceive due to the interaction between audio signals. In the present embodiment, the psychoacoustic unit 42 calculates a masking threshold and the like for stereo components using Binaural Masking Level Depression (BMLD).

The quantizing unit 43 scalar-quantizes each of the sub-band audio signals based on corresponding scale factor information to reduce quantization noise power in each of the sub-bands to be less than the masking threshold provided by the psychoacoustic unit 42 and then outputs quantization samples, so that a human can hear the sub-band audio signals but not perceive the noise therein. In other words, the quantizing unit 43 quantizes the sub-band audio signals in such a way that a noise-to-mask ratio (NMR), indicating a ratio of noise generated in each sub-band to the masking threshold calculated by the psychoacoustic unit 42, in full-bandwidth is 0 dB or less. An NMR of 0 dB or less indicates that a human cannot hear quantization noise.

The FGS encoding unit 44 encodes quantization samples and side information belonging to each layer and then packs the encoded quantization samples and side information into a hierarchical structure. The side information contains scale band information, coding band information, scale factor information, and coding model information corresponding to each layer. The scale band information and the coding band information may be packed as header information and then transmitted to a decoding apparatus. Alternatively, the scale band information and the coding band information may be encoded and packed as side information corresponding to each layer and then transmitted to the decoding apparatus. Also, since scale band information and coding band information is stored in the decoding apparatus in advance, the scale band information and the coding band information may not be transmitted to the decoding apparatus.

In more detail, the FGS encoding unit 44 encodes side information containing scale factor information and coding model information corresponding to a first layer from symbols composed of most significant bits to symbols composed of least significant bits with reference to the coding model information corresponding to the first layer. A second layer undergoes the same process as the first layer. In other words, a plurality of predetermined layers are sequentially encoded layer by layer.

The scale band information is necessary for properly performing quantization depending on the frequency characteristics of an audio signal and informs each layer of a scale band corresponding thereto when a frequency domain is divided into a plurality of bands and each of the bands is assigned a proper scale factor. As a result, each layer belongs to at least one scale band. Each scale band is assigned one scale factor. The coding band information is necessary for properly carrying out encoding depending on the frequency characteristics of an audio signal and informs each layer of an encoding band corresponding thereto when a frequency domain is divided into a plurality of bands and each of the bands is assigned a proper coding model. The scale bands and the encoding bands are properly divided by a test, and then scale factors and coding models corresponding thereto are determined.

FIG. 5 is a detailed block diagram of the FGS encoding unit 44 shown in FIG. 4. Referring to FIG. 5, the FGS encoding unit 44 includes a bit slicing unit 1, an encoding unit 2, and a bit packing unit 3. The FGS encoding unit 44 carries out the same functions as the encoding apparatus show in FIG. 1. Thus, blocks of the FGS encoding unit 44 are denoted by the same reference numerals as those of the encoding apparatus of FIG. 1 and repeated descriptions will be omitted.

FIG. 6 is a block diagram of an example of the realization of the decoding apparatus shown in FIG. 2. Referring to FIG. 6, the decoding apparatus includes an FGS decoding unit 61, a dequantizing unit 62, and inversely transforming unit 63. The FGS decoding unit 61 unpacks a bitstream up to a target layer and then decodes the bitstream on a layer-by-layer basis. In other words, the FGS decoding unit 61 decodes side information of each layer containing scale factor information and then decodes encoded quantization samples corresponding to each layer based on the coding model information to obtain quantization samples.

Scale band information and coding band information may be obtained from header information of the bitstream or may be obtained by decoding side information of each layer. Alternatively, the decoding apparatus may store scale band information and coding band information in advance.

The dequantizing unit 62 dequantizes and reconstructs quantization samples of each layer based on scale factor information corresponding to each layer. The inversely transforming unit 63 frequency/time-maps the reconstructed samples, transforms the mapped samples into time domain PCM audio data, and outputs the time domain PCM audio data.

Figure 7:
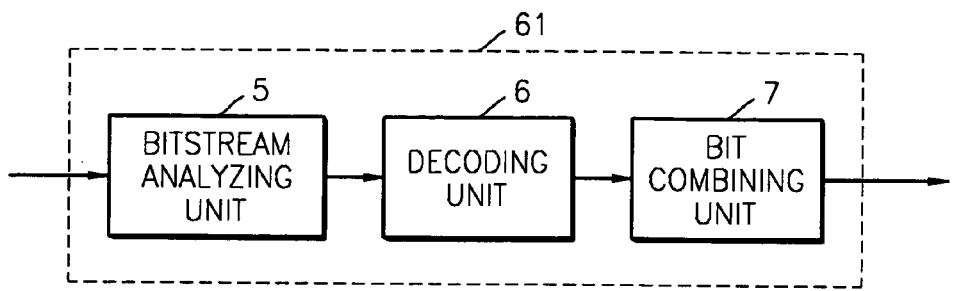
FIG. 7 is a detailed block diagram of an FGS decoding unit 61 shown in FIG. 6.

FIG. 7 is a detailed block diagram of the FGS decoding unit 61 of FIG. 6. Referring to FIG. 7, the FGS decoding unit 61 includes a bitstream analyzing unit 5, a decoding unit 6, and a bit combining unit 7. The FGS decoding unit 61 performs the same functions as the decoding apparatus shown in FIG. 2. Thus, blocks of the FGS decoding unit 61 are denoted by the same reference numerals as those of the decoding apparatus and repeated descriptions will be omitted.

Figure 8:
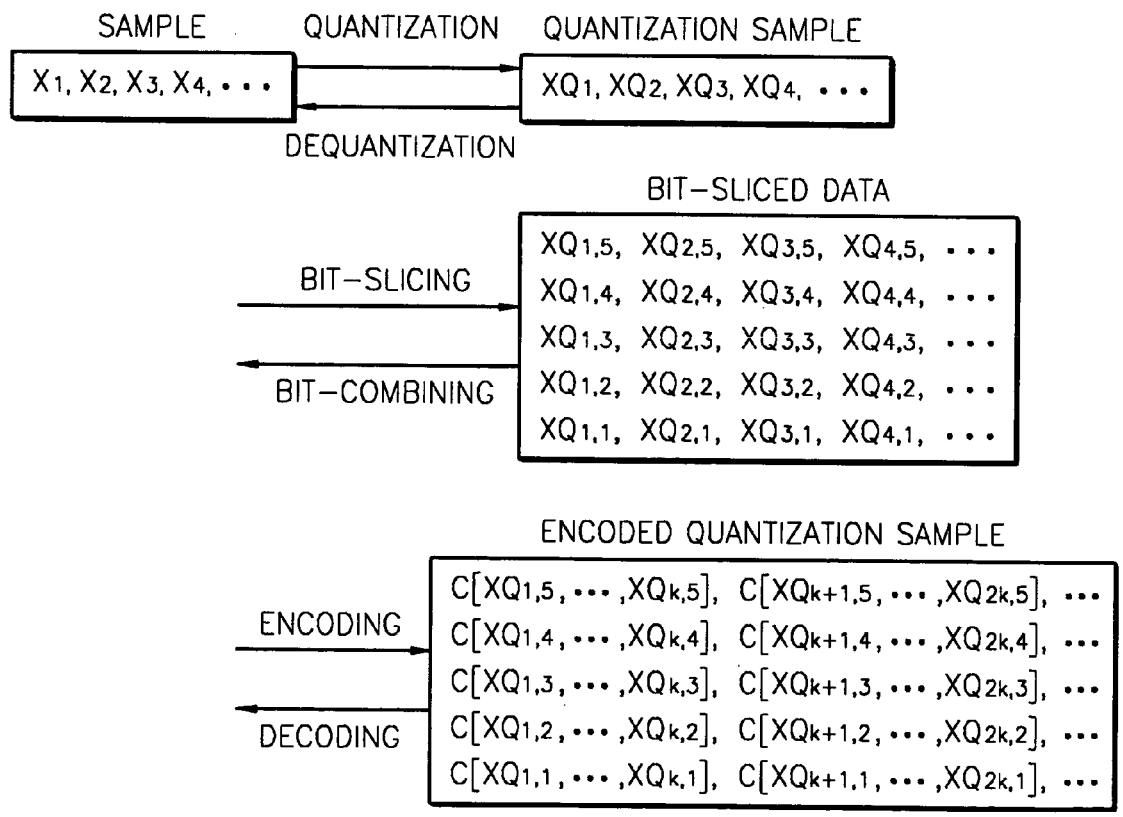
FIG. 8 is a view for explaining an encoding and/or decoding method performed by the encoding and/or decoding apparatus shown in FIG. 4 and/or FIG. 6.

FIG. 8 is a view for explaining an encoding and/or decoding method performed by the encoding and/or decoding apparatus shown in FIG. 4 and/or FIG. 6. Referring to FIG. 8, according to the encoding method, the transforming unit 41 of the encoding apparatus transforms input PCM audio data into samples "X1, X2, X3, X4, . . . ". The quantizing unit 42 quantizes the samples "X1, X2, X3, X4, . . . " into quantization samples "XQ1, XQ2, XQ3, XQ4 . . . ". When each of the quantization samples "XQ1, XQ2, XQ3, XQ4 , , . " is composed of 4 bits, the bit slicing unit 1 slices "XQ1" into "XQ1, 5, XQ1, 4, XQ1, 3, XQ1, 2, and XQ1, 1", "XQ2" into "XQ2, 5, XQ2, 4, XQ2, 3, XQ2, 2, and XQ2, 1", "XQ3" into "XQ3, 5, XQ3, 4, XQ3, 3, XQ3, 2, and XQ3,1", and "XQ4" into "XQ4, 5, XQ4, 4, XQ4, 3, XQ4, 2, and XQ4, 1". The encoding unit 2 packs most significant bits from bits corresponding to a low frequency to bits corresponding to a high frequency, slices the most significant bits into predetermined units to form vectors, and encodes the vectors. Here, "C[XQ1,5, . . . ,XQk,5]" is obtained by lossless-encoding vectors "XQ1,5, . . . ,XQk,5", and "C[XQk+1,5, . . . ,XQ2k,5]" is obtained by lossless-encoding vectors "XQk+1,5, . . . ,XQ2k,5". The remaining vectors are lossless-encoded in the same manner. Here k is an integer that is greater than or equal to "1".

The decoding apparatus shown in FIG. 6 performs the decoding method according to a process inverse to the encoding method.

Figure 9:
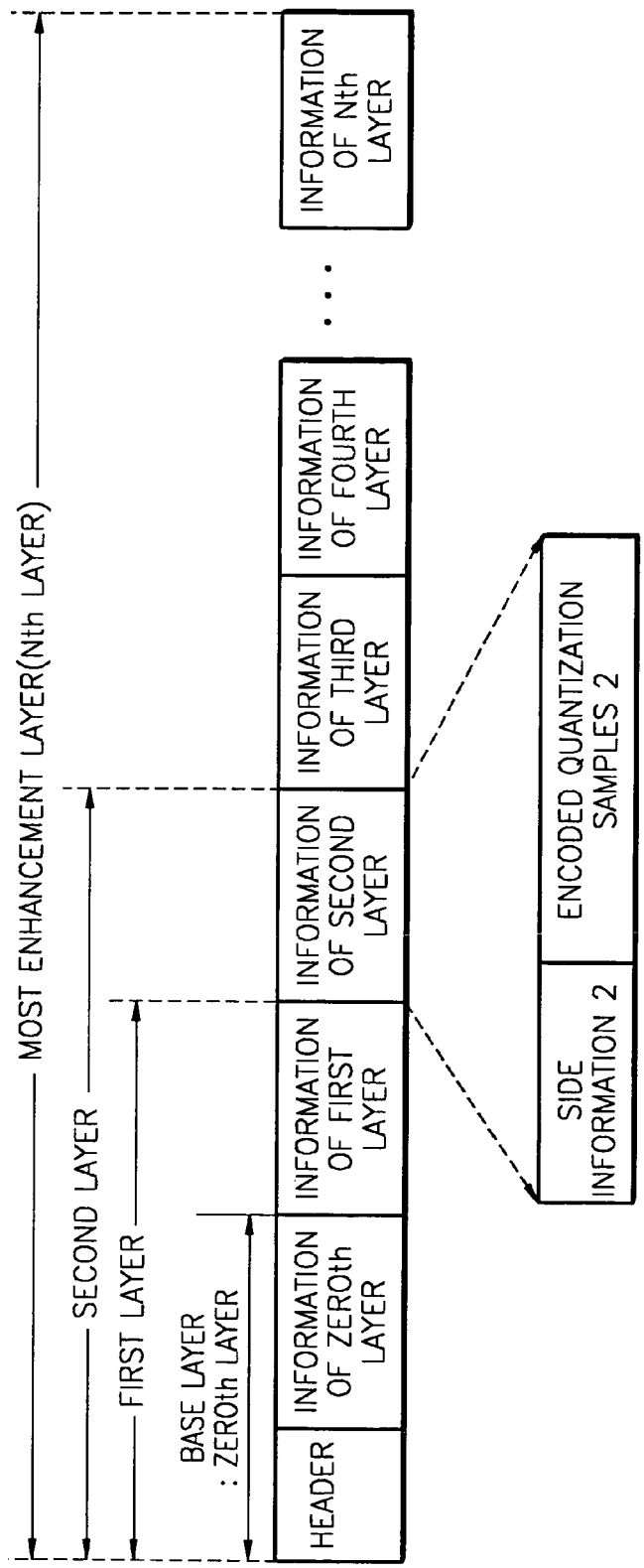
FIG. 9 illustrates the structure of a frame constituting a bitstream encoded into a hierarchical structure so as to control a bit rate according to the present invention.

FIG. 9 illustrates the structure of a frame constituting a bitstream encoded into a hierarchical structure so as to control a bit rate according to the present invention. Referring to FIG. 9, the frame of a bitstream according to the present invention is encoded by mapping quantization samples and side information into a hierarchical structure for fine grain scalability (FGS). In other words, the frame has a hierarchical structure in which a bitstream of a lower layer is included in a bitstream of an enhancement layer. Side information necessary for each layer is encoded on a layer-by-layer basis.

A header area in which header information is stored is located in the starting part of a bitstream, information of a zero$^{th}$ layer is packed, and information of first through N$^{th}$ layers that are enhancement layers is sequentially packed. A base layer ranges from the header area to the information of the zero$^{th}$ layer, a first layer ranges from the header area to the information of the first layer, and a second layer ranges from the header area to the information of the second layer. In the same manner, the most enhancement layer ranges from the header area to the information of the N$^{th}$ layer, i.e., from the base layer to the N$^{th}$ layer. Side information and encoded data is stored as information of each layer. For example, side information 2 and encoded quantization samples are stored as the information of the second layer. Here, N is an integer that is greater than or equal to "1".

Figure 10:
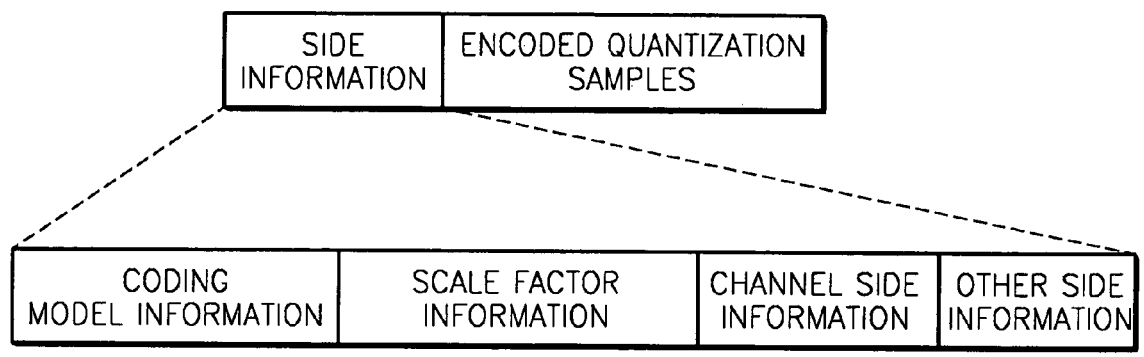
FIG. 10 illustrates the detailed structure of side information.

FIG. 10 illustrates the detailed structure of the side information. Referring to FIG. 10, side information and encoded quantization samples are stored as information of an arbitrary layer. In the present embodiment, side information contains coding model information, quantization factor information, channel side information, and other side information. The coding model information is information on a coding model to be used for encoding or decoding quantization samples contained in a corresponding layer. The scale factor information informs a corresponding layer of the size of a quantizing step suitable for quantizing or dequantizing audio data contained in the corresponding layer. The channel side information refers to information on a channel such as middle/side (M/S) stereo. The other side information is flag information indicating whether the M/S stereo is used.

Figure 11:
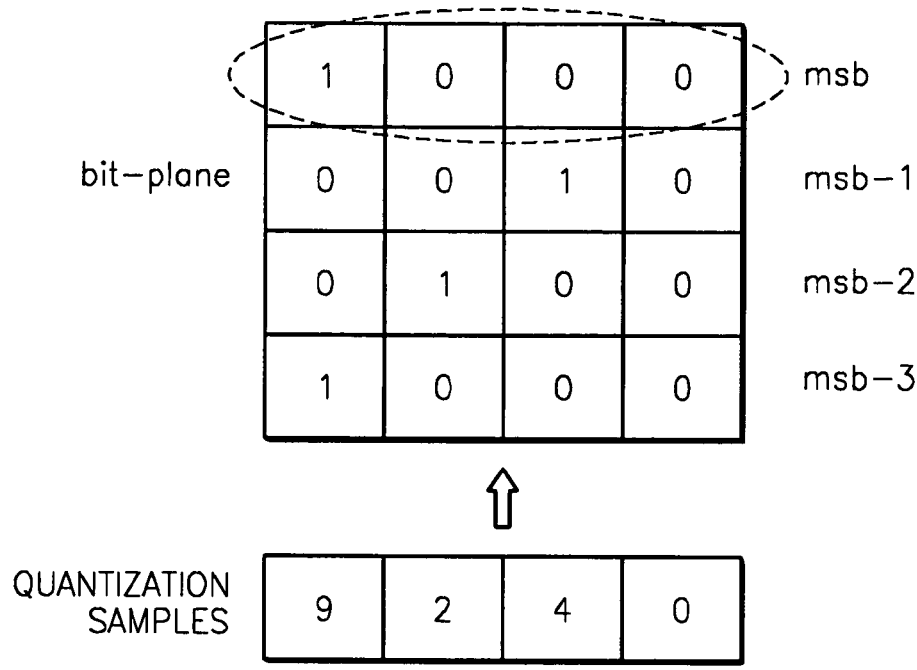
FIGS. 11 through 13 are views for explaining the encoding method of the present invention in detail.
Figure 12:
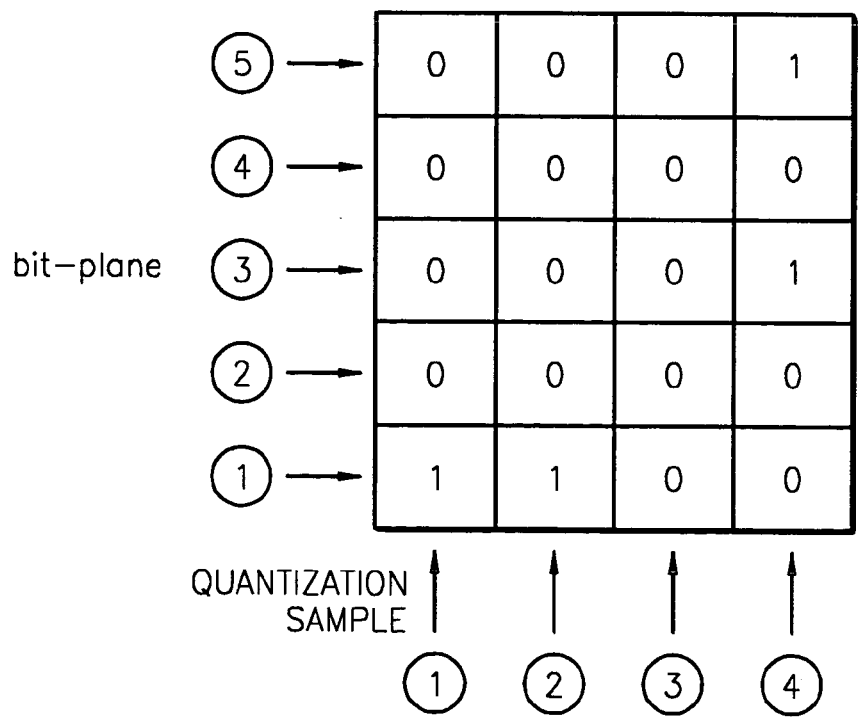
Figure 13:
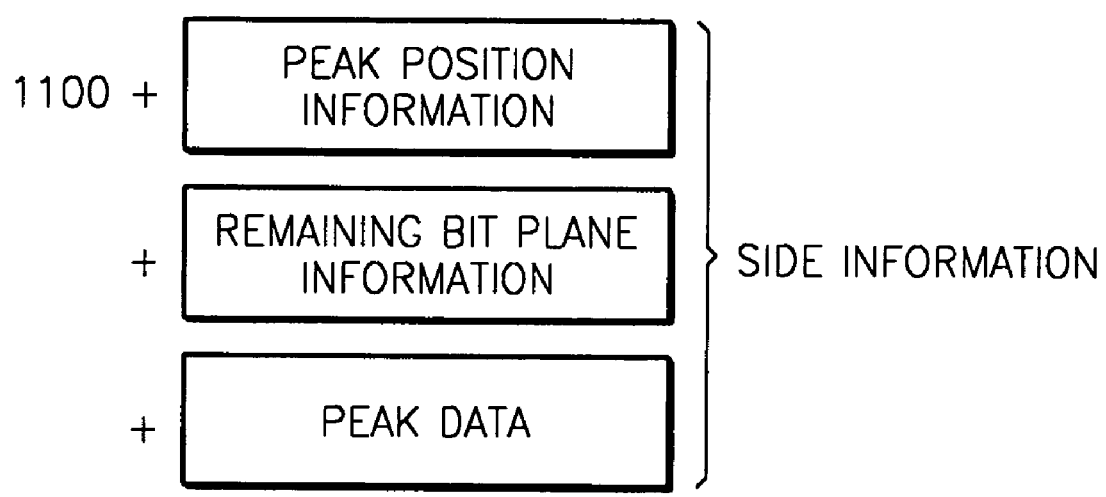

FIGS. 11 through 13 are views for explaining the encoding method of the present invention in detail. Referring to FIG. 11, the encoding unit 2 maps a plurality of quantization samples onto bit planes to express the plurality of quantization samples as binary data and then lossless-encodes the binary data within a bit range assigned to a corresponding layer from bit-sliced data composed of most significant bits to bit-sliced data composed of least significant bits. Significant information on the bit planes may be first encoded and then least significant information on the bit planes may be encoded.

In more detail, when quantization samples "9, 2, 4, and 0" arranged from a low frequency to a high frequency are mapped onto a bit plane, the quantization samples "9, 2, 4, and 0" are expressed as binary data "1001b", "0010b", "0010b", and "0000b", respectively. Bit-sliced data composed most significant bits msb is "1000", bit-sliced data composed of next significant bits msb-1 is "0010", bit-sliced data composed of significant bits msb-2 is "0100", and bit-sliced data composed of least significant bits msb-3 is "1000". Thus, lossless-encoding is performed in order of "1000", "0010", "0100", and "1000".

In blocks mapped onto bit planes of FIG. 12, bit planes ②, ③, ④, ⑤ of quantization samples ①, ②, ③ are filled with values of "0". However, in a case where quantization samples are encoded according to a method presented in FIG. 11, all of the quantization samples have to be encoded, thereby reducing an encoding efficiency. Accordingly, if only one quantization sample of a bit plane has a high peak value, i.e., values of "0" are gathered in at least a portion of the bit plane, the following method is carried out.

First, bit-sliced data of a bit plane ① except bit planes filled with values of "0", i.e., "1100", is encoded. Next, position information for indicating the position of a quantization sample except quantization samples filled with values of "0", i.e., a quantization sample having a peak value, is expressed as 2 bits, i.e., "11b". Thereafter, index information for indicating that parts filled with values of "0", i.e., not-encoded parts, are the bit planes ②, ③, ④ and ⑤ is expressed as 3 bits, i.e., "100b", and parts of the bit planes, ②, ③, ④ and ⑤ of the quantization sample ④, i.e., "1010b (peak data)", are encoded into 3–4 bits.

Accordingly, the above bit planes can be expressed by: 1100 (encoding)+2 bits (position information of peak)+3 bits (index information)+3–4 bits (1010—peak data).

Referring to FIG. 13, according to the encoding method of the present invention, when a predetermined bit plane is encoded, only at least a portion of bit-sliced data is encoded in consideration of an encoding efficiency and the remaining portion of the bit-sliced data is included in side information. In other words, the predetermined bit plane can be encoded as follows: bit-sliced data (1100)+peak position information+remaining bit plane information+peak data.

The above method is called a transformed bit-sliced encoding method. Whether the transformed bit-sliced encoding method is used is determined after considering the encoding efficiency. In other words, according to the transformed bit-sliced encoding method, the amount of bit-sliced data to be encoded is reduced, while the amount of side information to be encoded is increased. Accordingly, whether a predetermined bit plane is encoded according to the transformed bit-sliced encoding method is determined using an algorithm for estimating the number of bits to be encoded.

As described above, the present invention can provide a method and apparatus for encoding and/or decoding digital data by which an encoding efficiency can be increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of encoding digital data, the method comprising:
    mapping a plurality of samples constituting the digital data onto bit planes; and
    selectively encoding all of bit-sliced data of the bit planes from bit-sliced data composed of most significant bits mapped onto the bit planes to bit-sliced data composed of least significant bits in consideration of an encoding efficiency or according to a transformed bit-sliced encoding method, wherein side information corresponding to a plurality of layers and a plurality of encoded quantization samples are packaged into a hierarchical structure.

2. The method of claim 1, further comprising packaging the encoded samples into a hierarchical structure.

3. A method of encoding digital data, the method comprising:
    mapping a plurality of samples constituting the digital data onto bit planes; and
    selectively encoding all of bit-sliced data of the bit planes from bit-sliced data composed of most significant bits mapped onto the bit planes to bit-sliced data composed of least significant bits according to a transformed bit-sliced encoding method,
    wherein according to the transformed bit-sliced encoding method, a portion of bit-sliced data constituting a predetermined plane is lossless-encoded, and position information of a peak, the remaining bit plane information, and peak data are encoded as side information.

4. A method of encoding digital data, the method comprising:
    mapping a plurality of samples constituting the digital data onto bit planes; and
    selectively encoding all of bit-sliced data of the bit planes from bit-sliced data composed of most significant bits mapped onto the bit planes to bit-sliced data composed of least significant bits,
    wherein the encoding comprises:
    expressing the samples composed of sign data and magnitude data as binary data each having the same number of bits;
    bit-slicing magnitude data constituting expressed digital data;
    lossless-encoding bit-sliced data composed of most significant bits;
    encoding sign data of a sample that first has a non-zero bit of the encoded bit-sliced data; and
    performing the lossless-encoding and encoding from bit-sliced data composed of next significant bits to bit-sliced data composed of least significant bits.

5. The method of claim 4, wherein the encoding is performed according to Huffman-coding.

6. The method of claim 4, wherein the encoding is performed according to arithmetic-coding.

7. An apparatus for encoding digital data, the apparatus comprising:
a bit slicing unit that bit-slices a plurality of samples constituting the digital data to obtain bit-sliced data; and
an encoding unit that selectively encodes all of bit-sliced data of bit planes from bit-sliced data composed of most significant bits of the bit planes to bit-sliced data composed of least significant bits in consideration of an encoding efficiency or according to a transformed bit-sliced encoding method, wherein the bit packing unit packages side information and a plurality of lossless-encoded quantization samples corresponding to a plurality of layers into a hierarchical structure.

8. The apparatus of claim 7, further comprising a bit packing unit that packages the samples encoded by the encoding unit into a hierarchical structure.

9. The apparatus of claim 7, wherein the encoding unit Huffman-codes the bit-sliced data.

10. The apparatus of claim 7, wherein the encoding unit arithmetic-codes the bit-sliced data.

11. An apparatus for encoding digital data, the apparatus comprising:
a bit slicing unit that bit-slices a plurality of samples constituting the digital data to obtain bit-sliced data; and
an encoding unit that selectively encodes all of bit-sliced data of bit planes from bit-sliced data composed of most significant bits of the bit planes to bit-sliced data composed of least significant bits according to a transformed bit-sliced encoding method,
wherein the encoding unit lossless-encodes bit-sliced data of a portion of a predetermined bit plane according to the transformed bit-sliced encoding method, and position information of a peak, the remaining bit plane information, and peak data are encoded as side information.

12. An apparatus for encoding digital data, the apparatus comprising:
a bit slicing unit that bit-slices a plurality of samples constituting the digital data to obtain bit-sliced data; and
an encoding unit that selectively encodes all of bit-sliced data of bit planes from bit-sliced data composed of most significant bits of the bit planes to bit-sliced data composed of least significant bits,
wherein the bit slicing unit bit-slices magnitude data of samples that are composed of sign data and magnitude data and are expressed as binary data each having the same number of bits, and the encoding unit lossless-encodes bit-sliced data composed of most significant bits and sign data of a sample of the lossless-encoded bit-sliced data that first has a non-zero bit and then performs lossless-encoding to bit-sliced data composed of least significant bits in the same manner.

13. A method of decoding digital data, the method comprising:
analyzing a bitstream to obtain at least one encoded bit-sliced data corresponding to a predetermined bit plane and side information encoded according to a transformed bit-sliced encoding method;
decoding bit-sliced data corresponding to the predetermined bit plane with reference to the bit-sliced data and the side information; and
bit-combining the decoded bit-sliced data to obtain samples constituting the digital data.

14. The method of claim 13, wherein the analyzing comprises decoding position information of a peak, the remaining bit plane information, and peak data as side information.

15. An apparatus for decoding digital data, the apparatus comprising:
a bitstream analyzing unit that analyzes a bitstream to obtain at least one encoded bit-sliced data corresponding to a predetermined bit plane and side information encoded according to a transformed bit-sliced encoding method;
a decoding unit that decodes bit-sliced data corresponding to the bit plane with reference to the bit-sliced data and the side information; and
a bit combining unit that bit-combines the decoded bit-sliced data to obtain samples constituting the digital data.

16. The apparatus of claim 15, wherein the bitstream analyzing unit obtains position information of a peak, the remaining bit plane information, and peak data as side information.

* * * * *